(12) United States Patent
Gibbs (10) Patent No.: US 9,182,449 B2
(45) Date of Patent: Nov. 10, 2015

(54) METHOD AND SYSTEM FOR ESTIMATING BATTERY CAPACITY IN A VEHICLE

(71) Applicant: GM GLOBAL TECHNOLOGY OPERATIONS LLC, Detroit, MI (US)

(72) Inventor: James C. Gibbs, Brighton, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 364 days.

(21) Appl. No.: 13/650,732

(22) Filed: Oct. 12, 2012

(65) Prior Publication Data

US 2014/0103933 A1 Apr. 17, 2014

(51) Int. Cl.
*G01N 27/416* (2006.01)
*G01R 31/36* (2006.01)
*B60L 11/18* (2006.01)

(52) U.S. Cl.
CPC ......... *G01R 31/3634* (2013.01); *B60L 11/1861* (2013.01); *B60L 11/1864* (2013.01); *B60L 11/1877* (2013.01); *G01R 31/3662* (2013.01); *B60L 2240/545* (2013.01); *B60L 2240/547* (2013.01); *B60L 2240/549* (2013.01); *B60L 2260/44* (2013.01); *Y02T 10/7005* (2013.01); *Y02T 10/7044* (2013.01); *Y02T 10/7061* (2013.01)

(58) Field of Classification Search
CPC ............... G01R 31/3662; G01R 31/36; G01R 31/3627; G01R 31/3634; B60L 11/1861; B60L 11/1877; B60L 11/1864
USPC ..................................... 324/427, 430; 702/63
See application file for complete search history.

(56) References Cited

U.S. PATENT DOCUMENTS

| | | | | |
|---|---|---|---|---|
| 5,404,106 A * | 4/1995 | Matsuda | ........................ | 324/431 |
| 5,539,318 A * | 7/1996 | Sasaki | ............................ | 324/428 |
| 6,094,052 A * | 7/2000 | Arai et al. | ..................... | 324/428 |
| 6,114,838 A * | 9/2000 | Brink et al. | .................... | 320/136 |
| 6,563,318 B2 * | 5/2003 | Kawakami et al. | ........... | 324/426 |
| 7,728,555 B2 * | 6/2010 | Seo et al. | ....................... | 320/132 |
| 8,108,161 B2 * | 1/2012 | Tomura et al. | .................. | 702/63 |
| 2005/0035743 A1 * | 2/2005 | Kawakami et al. | ........... | 320/162 |
| 2007/0001679 A1 * | 1/2007 | Cho et al. | ....................... | 324/426 |
| 2008/0103709 A1 * | 5/2008 | Yun et al. | ........................ | 702/63 |
| 2010/0247988 A1 * | 9/2010 | Okumura et al. | ............... | 429/90 |
| 2011/0031048 A1 * | 2/2011 | Ohkura | ........................ | 180/65.1 |
| 2011/0037475 A1 * | 2/2011 | Ho | ................................. | 324/427 |
| 2011/0127958 A1 * | 6/2011 | Ishishita et al. | ............... | 320/109 |
| 2011/0148424 A1 * | 6/2011 | Chiang et al. | .................. | 324/427 |
| 2011/0224928 A1 * | 9/2011 | Lin et al. | ........................ | 702/63 |
| 2012/0029851 A1 * | 2/2012 | Nakayama et al. | ............. | 702/63 |
| 2012/0306450 A1 * | 12/2012 | Nakayama et al. | ........... | 320/134 |
| 2013/0027047 A1 * | 1/2013 | Yoshioka et al. | ............. | 324/426 |

* cited by examiner

*Primary Examiner* — M'Baye Diao
(74) *Attorney, Agent, or Firm* — Reising Ethington P.C.; Lionel D. Anderson (57) ABSTRACT

A system and method is provided for estimating the capacity of a battery element in a vehicle, such as a hybrid electric vehicle. In one embodiment, the method determines if one or more threshold conditions have been met (e.g., conditions pertaining to battery temperature or battery state-of-charge (SOC)) and calculates the internal resistance of the battery element. When the threshold conditions have been met, the method uses the calculated internal resistance to estimate the capacity of the battery element. A corresponding battery system is also provided that includes a battery element, one or more battery sensors, and a control module configured to perform the method described above.

17 Claims, 4 Drawing Sheets

METHOD AND SYSTEM FOR ESTIMATING BATTERY CAPACITY IN A VEHICLE

FIELD

The present invention generally relates to vehicle batteries, and more particularly, to methods and systems for estimating the capacity of a battery element in a vehicle, such as a hybrid electric vehicle.

BACKGROUND

In hybrid electric vehicles, it can be beneficial to have an accurate battery capacity estimate. For example, battery capacity can be used as an input to other algorithms such as those used to determine battery state-of-charge (SOC), to balance cells within the battery pack, or to determine the range of a hybrid electric vehicle, to cite a few possibilities.

One conventional way to estimate battery capacity is to take the known capacity of the battery when it was new, keep track of various usage-related parameters such as the total amount of charge flowing into and/or out of the battery since it was new, and then estimate battery capacity degradation over time based on this history. Historical usage techniques such as this, however, can be less than desirable in terms of accuracy, robustness, cost effectiveness, etc.

For instance, such techniques can result in fairly rudimentary estimates that lack the required level of accuracy for certain purposes, like vehicle range estimates. Furthermore, these types of techniques are not always robust because a loss of the historical usage data can result in the system being unable to accurately calculate battery capacity. Consider a vehicle service event where a battery control module containing the historical usage data has malfunctioned and needs to be replaced. Under normal circumstances, the new replacement module would not have the historical usage data from the previous broken module and, therefore, would be unable to generate accurate battery capacity estimates. A similar situation can occur when just the battery pack or a portion of the battery pack is replaced, but not the battery control module; this too, results in a scenario where the historical usage data does not correspond to the actual battery pack being monitored. In view of this, battery packs and control modules are oftentimes replaced in sets so as to avoid the issues described above, thereby resulting in additional costs.

SUMMARY

According to one embodiment, there is provided a method for estimating the capacity of a battery element in a vehicle. The method may include the steps of: (a) determining if one or more threshold conditions have been met; (b) calculating the internal resistance of the battery element; and (c) when the threshold conditions have been met, using the calculated internal resistance of the battery element to estimate the capacity of the battery element.

According to another embodiment, there is provided a method for estimating the capacity of a battery element in a vehicle. The method may include the steps of: (a) calculating the internal resistance of the battery element; (b) acquiring one or more values for one or more battery-related parameters that pertain to the battery element; and (c) using the calculated internal resistance of the battery element and the one or more acquired battery-related parameter values to estimate the capacity of the battery element.

According to another embodiment, there is provided a battery system for a vehicle. The battery system may include: a battery element; one or more battery sensors configured to detect electrical parameters of the battery element; and a control module electrically coupled to the one or more battery sensors. The control module is configured to: (a) determine if one or more threshold conditions have been met; (b) calculate the internal resistance of the battery element using the detected electrical parameters of the battery element; and (c) when the one or more threshold conditions have been met, estimate the capacity of the battery element based on the calculated internal resistance of the battery element.

DRAWINGS

Preferred exemplary embodiments will hereinafter be described in conjunction with the appended drawings, wherein like designations denote like elements, and wherein.

DESCRIPTION

The method and system described herein may be used to estimate or otherwise determine the capacity of a battery element (e.g., an entire battery pack, a portion of a battery pack, a group of cells within a battery pack, an individual cell, etc.) in a vehicle. Battery capacity generally refers to the amount of electrical charge that a battery element can store or deliver, and sometimes is expressed in terms of the maximum electrical charge (Amp·Hours) that the battery element can deliver to a load under a specific set of conditions. Skilled artisans will appreciate that having an accurate battery capacity estimate can be useful for certain functions or features in a vehicle, such as a hybrid electric vehicle. For example, a range estimate for the vehicle can be impacted by the accuracy of a battery capacity value and is generally the type of estimate that requires a high level of accuracy. Cell balancing algorithms are another example of a function that rely on battery capacity estimates and require that they have a requisite level of accuracy. Other such functions and features certainly exist.

For purposes of illustration and clarity, the following description is generally directed to an embodiment where the battery element is an entire battery pack. Therefore, the capacity being estimated is that of the entire battery pack. It will be appreciated, however, that the present method and system are not so limited, as they may also be used to estimate the capacity of other battery elements, such as a region or portion of the battery pack, a group of cells within the battery pack, an individual cell, or some other battery element. Accordingly, those embodiments relating to estimating the capacity of battery elements other than an entire or overall battery pack remain within the spirit and scope of the present disclosure. In one exemplary embodiment, the system and method calculate, estimate and/or otherwise determine an internal resistance for the battery pack and then use the internal resistance to estimate the capacity of the battery pack.

Figure 1:
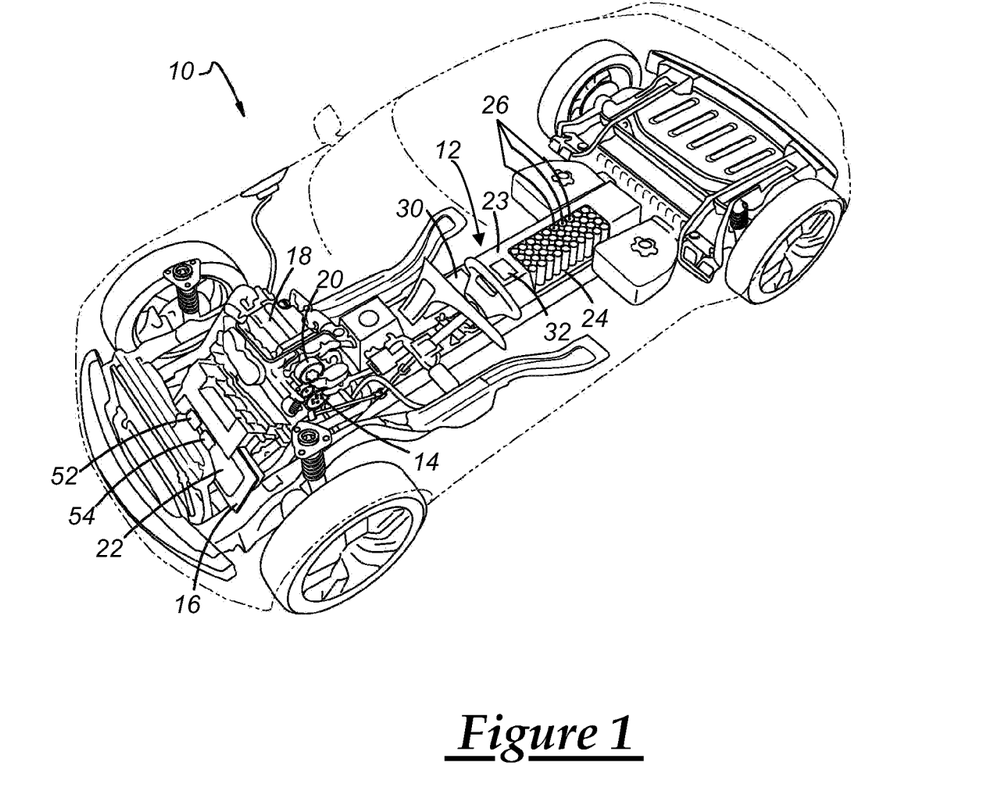
FIG. 1 is a schematic diagram of an exemplary hybrid electric vehicle.

With reference to FIG. 1, there are shown some of the components of an exemplary hybrid electric vehicle 10, with which the present method and system may be used. Although the following description is provided in the context of the particular hybrid electric vehicle 10 illustrated in FIG. 1, it will be appreciated that this vehicle is merely exemplary and that other vehicles may certainly be used instead. For example, the method and system described herein may be used with any type of vehicle having a high-voltage battery pack, including a hybrid electric vehicle (HEV), a plug-in hybrid electric vehicle (PHEV), an extended-range electric vehicle (EREV), or a battery electrical vehicle (BEV), to cite a few possibilities. According to an exemplary embodiment, vehicle 10 generally includes a vehicle battery system 12, an electric motor 14, an inverter/converter 16, an engine 18, a generator 20, and a control module 22.

Figure 2:
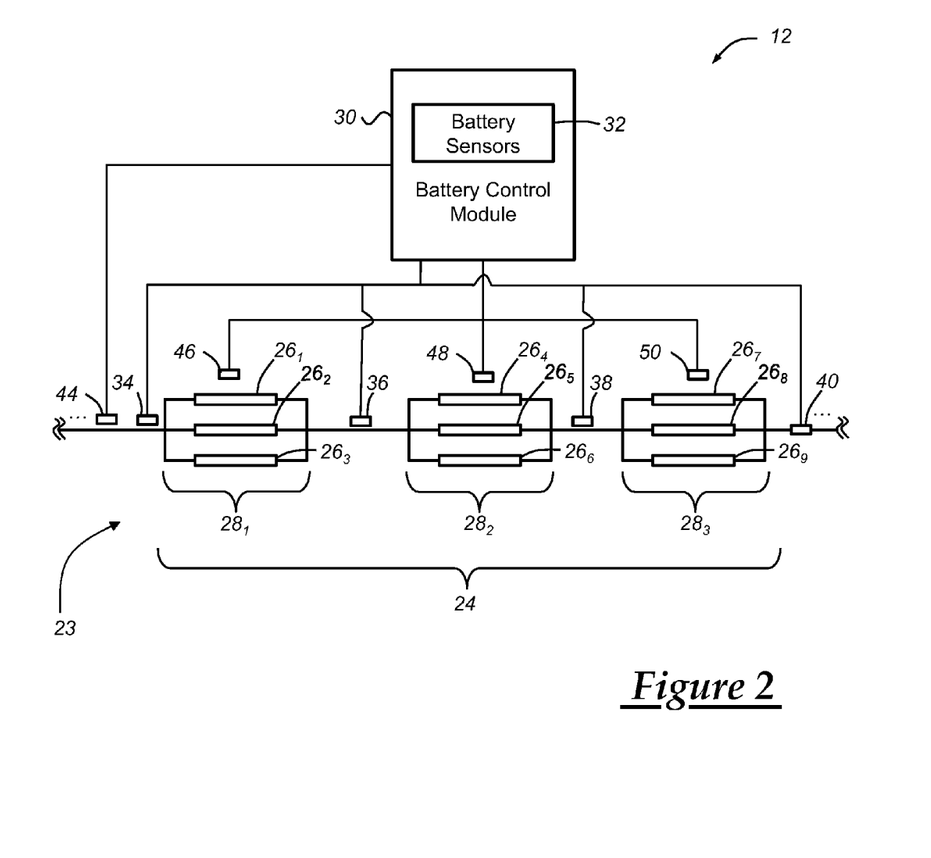
FIG. 2 is a schematic block diagram of a portion of an exemplary vehicle battery pack that has a number of individual battery cells and may be used in a number of different vehicles, such as the one illustrated in FIG. 1.

FIGS. 1 and 2 illustrate portions of an exemplary vehicle battery system 12 that includes a battery 23, a battery pack 24, a battery control module 30, and battery sensors 32. Battery 23 that may store electrical energy for vehicle propulsion and/or to meet other electrical needs of the vehicle, such as, for example, the needs of power applications of the vehicle. According to an exemplary embodiment, battery 23 includes a high-voltage battery pack 24 (e.g., 40V-600V) having a number of individual battery cells 26 (i.e., $26_1$, $26_2$ ... $26_N$), a number of cell blocks 28 (i.e., $28_1$, $28_2$ ... $28_N$). Battery pack 24 includes a collection of individual battery cells 26 that may be connected in series, parallel, or a combination of both in order to deliver a desired voltage, amperage, capacity, power density, and/or other performance characteristics. In the example shown in FIG. 2, three battery cells $26_1$-$26_3$ are wired in parallel to form a cell block $28_1$. Similarly, battery cells $26_4$-$26_6$ form cell block $28_2$, battery cells $26_7$-$26_9$ form cell block $28_3$, and so on. Cell blocks $28_1$-$28_3$ are, in turn, wired in series to form parts of battery pack 24. FIG. 2 illustrates only one potential embodiment of battery pack 24, as other arrangements, connections, and/or embodiments are also possible. For instance, more or less than three battery cells may form a cell block, or the cell blocks can be wired together with a combination of parallel and series connections, instead of just being wired together in series.

The battery system 12 may be either a power battery system or an energy battery system. In an embodiment where the battery system is a power battery system, the battery pack 24 is used for what are known as "power applications," which generally include those functions and applications where the battery pack is primarily used for short bursts or pulses of power in or out of the battery pack. Some examples where a brief burst or pulse of power is provided by the battery pack include vehicle starting events, transmission shifts, brief wide open throttle situations, etc. Examples of a brief burst or pulse of power being provided to the battery pack include instances when a motor is used to dampen or quickly slow down the engine or during regenerative braking events—these events create energy that needs to go somewhere. Generally speaking, power battery systems are used to supplement the electrical needs of the vehicle and are not regularly relied on for long term charge and discharge cycles like those experienced during sustained vehicle propulsion that result in large state-of-charge (SOC) swings (e.g., swings greater than 30%).

Alternatively, in an embodiment where the battery system 12 is an energy battery system, the battery pack 24 is frequently used for applications having long term charge and discharge cycles that require a lot of energy from the battery pack. One example of an "energy application" involves long term or sustained vehicle propulsion where the battery pack provides significant quantities of energy to drive one or more electric motors that in turn propel a hybrid electric vehicle (HEV) or a battery electric vehicle (BEV). These types of energy applications usually take advantage of a much larger SOC swing in the battery pack. Although the method and system described herein may be used with any number of different battery systems, including both power and energy battery systems, the method and system are particularly well suited for use with a non-plug-in hybrid electric vehicle that includes a power battery system.

Whether battery system 12 includes a power battery system, an energy battery system, or some other type of system, battery pack 24 may utilize any suitable battery chemistry, including those that are based on the following technologies: lithium ion, nickel metal hydride (NiMH), nickel cadmium (NiCd), sodium nickel chloride (NaNiCl), or some other battery technology. According to one example, battery pack 24 includes a number of lithium-ion battery cells. Battery pack 24 should be designed to withstand repeated charge and discharge cycles, and may be used in conjunction with other energy storage devices, such as capacitors, super capacitors, inductors, etc. Those skilled in the art will appreciate that the vehicle battery packs may be provided according to any number of different embodiments, may be connected in any number of different configurations, and may include any number of different sub-components, like sensors, control units, and/or any other suitable components known in the art.

Battery control module 30 may include any variety of electronic processing devices, memory or storage devices, input/output (I/O) devices, and any other known components, and may perform various control, monitoring, and/or communication related functions. For example, battery control module 30 may receive sensor signals from various battery sensors 32 and evaluate, analyze, and/or process those signals in an effort to control or monitor one or more aspects of the battery system 12. In one example, battery control module 30 receives and packages the sensor signals from battery sensors 32 into a sensor message, and then sends the message to control module 30 or some other device over a suitable connection, such as a CAN bus, a system management bus (SM-Bus), a proprietary communication link, etc. It is possible for battery control module 30 to gather battery sensor readings and store them in local memory along with pertinent battery characteristics and background information pertaining to the battery's cell chemistry, cell capacity, upper and lower battery voltage limits, battery current limits, battery temperature limits, temperature profiles, battery impedance, number or history of charge/discharge events, etc. Additionally, in an exemplary embodiment, the battery control module 30 is configured to carry out or perform one or more steps of the present method described in greater detail below. It should be appreciated that battery control module 30 may be a stand-alone electronic module, it may be incorporated or included within another electronic module in the vehicle (e.g., control module 22), it may be part of a larger network or system, it may be located within the vehicle battery pack 24, or it may be external to the battery pack 24, to name a few possibilities. Battery control module 30 is not limited to the schematic illustration shown in FIG. 1 and described above. In one embodiment, battery control module 30 includes one or more battery sensors 32.

Battery sensors 32 may include any variety of different sensing components or elements, and may monitor a variety of battery-related parameters or conditions such as voltage, current, SOC, state-of-health (SOH), temperature of the battery pack, etc. Battery sensors 32 may include sensors that are integrated within the battery system 12 or battery pack 24 (e.g., an intelligent or smart battery), are externally located outside the battery system 12 or pack 24, or are provided according to some other known arrangement. Battery sensors 32 may monitor, sense, detect, measure, or otherwise determine battery-related parameters or conditions on a cell-by-cell basis, as an average of a collection or block of cells or region of the battery pack 24, as an average of the entire battery pack 24, or according to some other method known in the art. In an exemplary embodiment, battery sensors 32 include one or more voltage sensors (e.g., sensors 34-40) for sensing individual battery cell or cell block voltages, a voltage sensor 42 for sensing the overall voltage across the battery pack 24, a current sensor 44 for sensing a current flow through the battery pack 24, one or more temperature sensors (e.g., sensors 46-50) for sensing or detecting the temperature of the battery pack 24, and any number of other sensors known in the art. Sensors 34-50 may be electrically connected (e.g., by a wired connection or wirelessly) to and configured for communication with battery control module 30, control module 22, and/or to any other suitable device.

Electric motor 14 may use electrical energy stored in vehicle battery pack 24 to drive one or more vehicle wheels, which in turn propels the vehicle. While FIG. 1 schematically depicts electric motor 14 as a single discrete device, the electric motor may be combined with a generator (a so-called "mogen") or it may include multiple electric motors (e.g., separate motors for the front and rear wheels, separate motors for each wheel, separate motors for different functions, etc.), to cite a few possibilities. Vehicle 10 is not limited to any one particular type of electric motor, as many different motor types, sizes, technologies, etc. may be used. In one example, electric motor 14 includes an AC motor (e.g., a multi-phase induction motor, etc.), as well as a generator that can be used during regenerative braking. Electric motor 14 may be provided according to any number of different embodiments (e.g., AC or DC motors, brushed or brushless motors, permanent magnet motors, etc.), it may be connected in any number of different configurations, and it may include any number of different components, like cooling features, sensors, control units, and/or any other suitable components known in the art.

Inverter/converter 16 may act as an intermediary between vehicle battery system 12 and electric motor 14, as these two devices are oftentimes designed to function according to different operational parameters. For example, during vehicle propulsion, inverter/converter 16 may step-up the voltage from battery system 12 and convert the current from DC to AC in order to drive electric motor 14, while during regenerative braking, the inventor/converter may step-down the voltage generated by a braking event and convert the current from AC to DC so that it can be properly stored by the battery system. In a sense, the inverter/converter 16 manages how these different operational parameters (i.e., AC versus DC, various voltage levels, etc.) work together. Inverter/converter 16 may include an inverter for DC to AC conversion, a rectifier for AC to DC conversion, a step-up converter or transformer for increasing the voltage, a step-down converter or transformer for decreasing the voltage, other suitable energy management components, or some combination thereof. In the exemplary embodiment shown, inverter/converter units are integrated into a single bi-directional device; however, other embodiments are certainly possible. It should be realized that inverter/converter 16 may be provided according to any number of different embodiments (e.g., with separate inverter and converter units, bidirectional or unidirectional, etc.), may be connected in any number of different configurations, and may include any number of different components, like cooling systems, sensors, control units, and/or any other suitable components known in the art.

Engine 18 may drive generator 20 using conventional internal combustion techniques, and may include any suitable type of engine known in the art. Some examples of suitable engines include gasoline, diesel, ethanol, flex-fuel, naturally aspirated, turbo-charged, super-charged, rotary, Otto-cycle, Atkins-cycle, and Miller-cycle engines, as well as any other suitable engine type known in the art. According to the specific embodiment shown here, engine 18 is a small fuel-efficient engine (e.g., a small displacement, turbo-charged four-cylinder engine) that uses its mechanical output to turn generator 20. Skilled artisans will appreciate that engine 18 may be provided according to any number of different embodiments, may be connected in any number of different configurations (e.g., engine 18 could be part of a parallel hybrid system where the engine is also mechanically coupled to the vehicle wheels instead of exclusively being used to generate electricity), and may include any number of different components, like sensors, control units, and/or any other suitable components known in the art.

Generator 20 is mechanically coupled to engine 18 so that the mechanical output of the engine causes the generator to create electrical energy that may be provided to the vehicle battery system 12, the electric motor 14, or both. It is worth noting that generator 20 may be provided according to any number of different embodiments (e.g., the generator of motor 14 and generator 20 may be combined into a single unit), may be connected in any number of different configurations, and may include any number of different components, like sensors, control units, and/or any other suitable components known in the art. Generator 20 is not limited to any specific generator type or embodiment.

Control module 22 may be used to control, govern, or otherwise manage certain operations or functions of vehicle 10 and/or one or more components or modules thereof (e.g., battery system 12). In an exemplary embodiment, control module 22 includes a processing device 52 and a memory device 54. Processing device 52 may include any type of suitable electronic processor (e.g., a microprocessor, a microcontroller, an application specific integrated circuit (ASIC), etc.) that executes instructions for software, firmware, programs, algorithms, scripts, etc. This processor is not limited to any one type of component or device. Memory device 54 may include any type of suitable electronic memory means and may store a variety of data and information. This includes, for example: sensed battery-battery related conditions; values of battery-related parameters; look-up tables and other data structures; software, firmware, programs, algorithms, scripts, and other electronic instructions; component characteristics and background information, etc. The present method—as well as any other electronic instructions and/or information needed for such tasks—may also be stored or otherwise maintained in memory device 54 such that control module 22 may be configured to perform one or more steps of the method described in greater detail below. Control module 22 may be electronically connected to other vehicle devices and modules (e.g., battery control module 30) via I/O devices and suitable connections, like a communications bus, so that they can interact as required. These are, of course, only some of the possible arrangements, functions, and capabilities of control module 22, as others are certainly possible. Depending on the particular embodiment, control module 22 may be a stand-alone electronic module (e.g., a vehicle integration control module (VICM), a traction power inverter module (TPIM), a battery power inverter module (BPIM), etc.), it may be incorporated or included within another electronic module in the vehicle (e.g., a power train control module, an engine control module, a hybrid control module, the battery control module 30, etc.), or it may be part of a larger network or system (e.g., a battery management system (BMS), a vehicle energy management system, etc.), to name a few possibilities.

Again, the preceding description of exemplary hybrid electric vehicle 10 and the drawing in FIG. 1 are only intended to illustrate one potential vehicle arrangement and to do so in a general way. Any number of other vehicle arrangements and architectures, including those that differ significantly from the one shown in FIG. 1, may be used instead.

Figure 3:
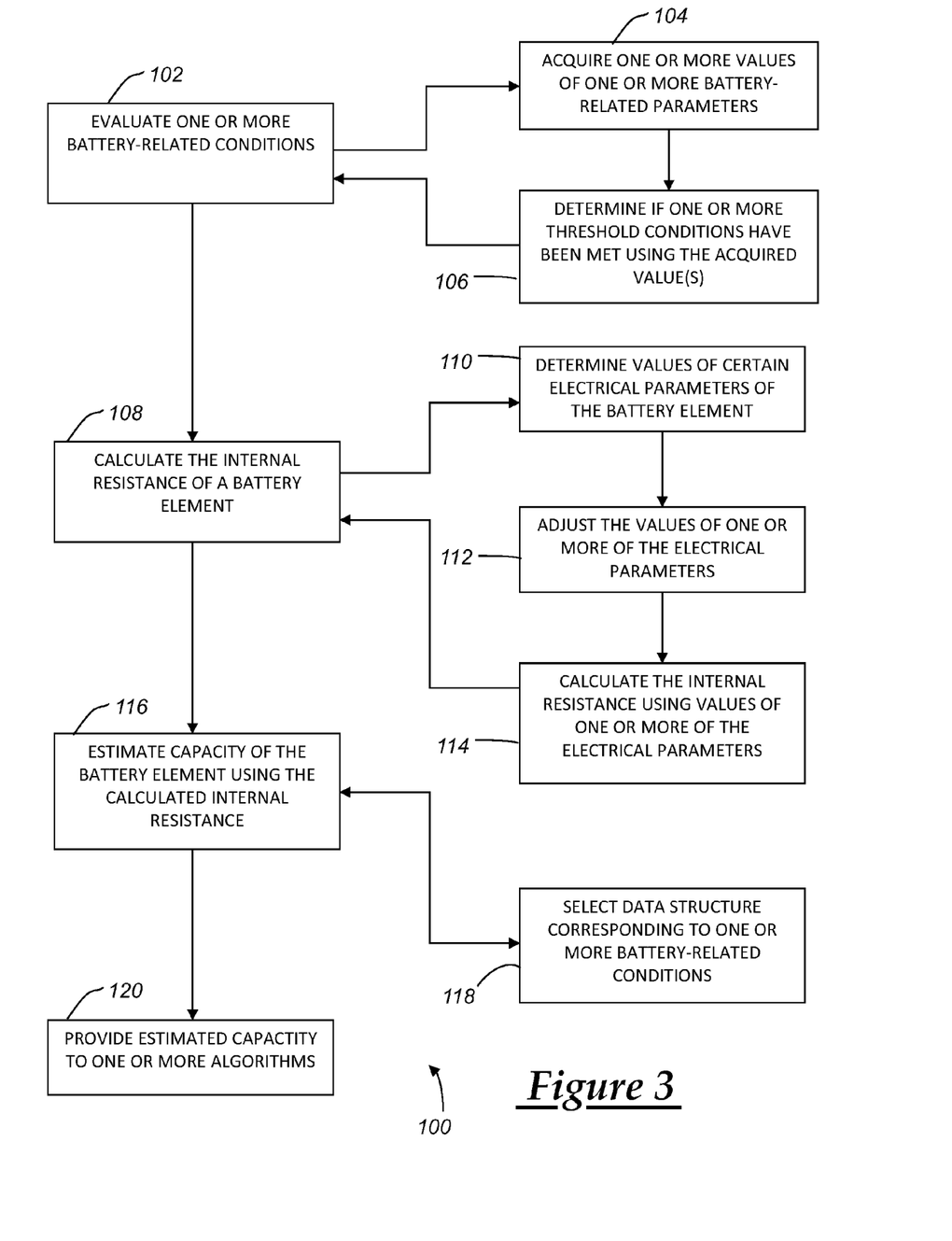
FIG. 3 is a flowchart showing some of the steps of an exemplary method for estimating capacity and may be used with a battery element, such as the battery pack illustrated in FIG. 2.

Turning to FIG. 3, there is shown an exemplary method 100 for estimating the capacity of a battery element, such as, for example and without limitation, a battery pack of a battery system (e.g., battery pack 24 of battery system 12 described above). It will be appreciated that while the description below is primarily with respect to the use of the present method to estimate the capacity of a battery element comprising a battery pack, the present disclosure is not meant to be so limited. Rather, those of ordinary skill in the art will appreciate that the present method may be used to estimate the capacity of any number of other battery elements, such as, for example, a portion of a battery pack, a block cells in a battery pack, or an individual cell in a battery pack. Accordingly, the present disclosure is not limited to any one particular type of battery element.

The method 100 may use various readings, conditions, parameters, information, comparisons, calculations, etc. to estimate the capacity of a battery pack. For example, the method may utilize value(s) of one or more electrical parameters of a battery pack for which a correlation with battery pack capacity can be made. In such an embodiment, and as will be described in greater detail below, the method may utilize value(s) of the relevant electrical parameter(s) in conjunction with the corresponding correlation between that or those parameter(s) and battery pack capacity to estimate the capacity of the battery pack. Alternatively, provided a correlation exists, the method may comprise utilizing the parameter value(s) apart from the correlation (e.g., the parameter value(s) may be plugged into a battery pack capacity-estimating equation or algorithm).

In an exemplary embodiment, the electrical parameter utilized by the method is the internal resistance of the battery pack. More particularly, it has been determined that under one or more battery-related conditions, such as, for example, temperature of the battery pack, SOC of the battery pack, current flowing through the battery pack, overall pack voltage, etc., a correlation can be made between the internal resistance of a battery pack and the capacity of that battery pack. Accordingly, in an exemplary embodiment, and as will be described in greater detail below, the method utilizes the internal resistance of a battery pack to estimate the capacity of that battery pack. More particularly, the method may utilize the internal resistance of a battery pack and the established correlation between internal resistance and capacity to estimate the capacity of the battery pack. Alternatively, the method may utilize the internal resistance of a battery pack apart from the correlation (e.g., the value of the internal resistance may be plugged into a battery pack estimating equation or algorithm).

Figure 4:
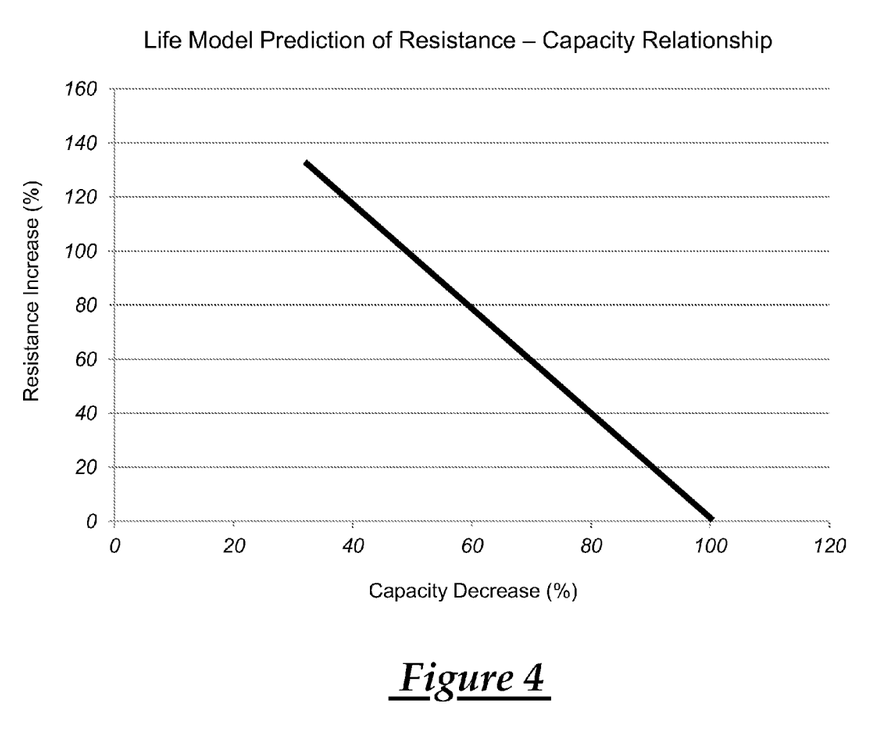
FIG. 4 is a graphical representation illustrating the linear relationship between the internal resistance and capacity of a battery pack under certain battery-related conditions.

In an embodiment wherein the internal resistance of a battery pack is utilized to estimate battery pack capacity, the internal resistance/capacity correlation may be determined or established in a number of ways. For instance, the correlation may be determined or based on a relationship that exists between battery pack internal resistance and capacity when certain battery-related conditions are met. For example and with reference to FIG. 4, it has been found through bench testing and empirical data resulting therefrom that under certain battery-related conditions, namely, the temperature of the battery pack exceeding 40° F. (4° C.) and the SOC of the battery pack falling within the range of 35-65%, and for battery packs having certain battery chemistries (e.g., lithium ion), a linear relationship exists between the internal resistance and capacity of a battery pack (i.e., the change in internal resistance is linearly related to the change in battery pack capacity). As such, a linear regression technique can be used to correlate any number of internal resistance values of battery packs having the appropriate battery chemistries with corresponding capacity magnitudes. This correlation can then be used to estimate a capacity magnitude for a battery pack having the appropriate chemistry and for which the internal resistance is calculated when the appropriate battery-related conditions are met.

Accordingly, using empirical data, it can be determined for one or more battery-related conditions whether an internal resistance/capacity relationship exists, and if so, that relationship may be used to correlate internal resistance values calculated under those particular battery-related conditions with corresponding capacity magnitudes. As described above, and as will be described in greater detail below, that correlation may then be used to estimate the capacity of a battery pack having the appropriate battery chemistry for any given internal resistance calculated under that or those particular battery-related conditions.

Alternatively, even if an internal resistance/capacity relationship does not exist for certain battery-related conditions or combinations of conditions, an internal resistance/capacity correlation can still be established for that or those battery-related conditions, provided enough empirical data has been collected. More particularly, an internal resistance/capacity correlation can be made for battery packs having certain chemistries strictly through bench testing (as opposed to using bench testing and an existing relationship (e.g., linear relationship)) by determining capacity magnitudes corresponding to any number of internal resistances calculated under those particular battery-related conditions. That correlation may then, as described above, be used to estimate the capacity of a battery pack having the appropriate chemistry when an internal resistance calculated under that or those battery-related conditions is one for which a capacity magnitude was determined during testing. Thus, it will be appreciated in view of the above that a correlation between internal resistance and battery pack capacity may be determined in a number of ways.

Accordingly, since, as described above, battery pack internal resistance may be correlated with battery pack capacity, in an exemplary embodiment, the internal resistance of a battery pack is used to estimate the capacity of the battery pack. In such an embodiment, because the internal resistance/capacity correlation is dependent upon one or more battery-related conditions, in an embodiment such as that illustrated in FIG. 3, the method 100 comprises a step 102 of evaluating one or more preliminary or threshold battery-related conditions. Evaluating step 102, may comprise a number of substeps.

For example, step 102 may comprise a substep 104 of acquiring one or more values for one or more battery-related parameters that correspond to the battery-related conditions being evaluated. These battery-related parameters may include, for example and without limitation, the temperature of the battery pack, the SOC of the battery pack, the current flowing through the battery pack, the overall voltage of the battery pack, etc. Accordingly, if one of the conditions being evaluated relates to the temperature of the battery pack, substep 104 comprises acquiring a value of the temperature of the battery pack. Similarly, if one of the conditions relates to the SOC of the battery pack, substep 104 comprises acquiring the magnitude of the SOC of the battery pack. Regardless of the parameter, the values thereof may be acquired in a number of ways.

In an exemplary embodiment, the value(s) may be acquired using one or more sensors, such as, for example, the sensors 32 described above. In such an embodiment, the sensor(s) is/are operable to sense, measure, or detect values of the battery-related parameters of interest, or parameters that may be used to calculate values or magnitudes of one or more battery-related parameters of interest. In an exemplary embodiment, the sensor(s) is/are electrically connected to the component that is configured to evaluate the battery-related condition(s) of interest (e.g., the battery control module 30, the control module 22, etc. of the vehicle 10). Accordingly, in such an embodiment, the component configured to perform evaluating step 102 may be configured to acquire the value(s) of the battery-related parameters of interest directly from the sensor(s).

In another exemplary embodiment, the value(s) of the parameters of interest may be acquired from one or more memory or other storage devices of components to which the sensor(s) is/are electrically connected, or that are configured to store values of the battery-related parameters sensed, measured, or detected by the sensor(s). For example, in an exemplary embodiment, the value(s) of the parameters of interest may be acquired from the memory 54 of the control module 22, a memory of the battery control module 30, or any other suitable memory or storage device that is part of or accessible by the component performing evaluation step 102. In such an embodiment, if the component whose memory contains the parameter value(s) being acquired is not the component acquiring that or those value(s), the acquiring component is electrically connected to and configured for communication with the other component so as to allow for the acquisition of the parameter value(s).

Once the value(s) of the battery-related parameters of interest is/are acquired, in an exemplary embodiment the evaluating step 102 includes a substep 106 of processing the acquired value(s) to determine whether one or more preliminary or threshold battery-related conditions are met. One purpose for determining whether the preliminary or threshold condition(s) is/are met is to determine whether an established internal resistance/capacity correlation exists that, in an exemplary embodiment, can be used to estimate battery capacity.

More particularly, and as described above, under certain conditions, a correlation can be made between internal resistance and capacity of a battery pack. Accordingly, if those conditions are met, any internal resistance calculated under those conditions can be correlated with a corresponding capacity magnitude. Thus, in an exemplary embodiment, if the predetermined conditions are met, method 100 may proceed to the steps described below. Conversely, however, if that or those conditions are not met, the correlation based on that or those conditions cannot be utilized, and thus, method 100 would not proceed to the steps described below. Rather, in an exemplary embodiment, method 100 would stop or return back to step 102, and substep 104 thereof, in particular, where step 102 would be repeated.

For example, it has been determined that for lithium ion batteries, there is linear relationship between the internal resistance and capacity of a battery pack when the temperature of the battery pack exceeds a predetermined minimum temperature (e.g., 40° F. (4° C.)), and the SOC of the battery pack is within a predetermined range (e.g., 35-65%). Accordingly, in an exemplary embodiment, substep 104 of acquiring one or more values for certain battery-related parameters comprises acquiring a value of the temperature of the battery pack (e.g., measuring the temperature with temperature sensor(s) 46-50), and acquiring (e.g., determining) a value of the SOC of the battery pack. Substep 106 then comprises processing the acquired temperature and SOC values. In an exemplary embodiment, this entails comparing the acquired temperature value with a predetermined minimum temperature threshold value (i.e., 40° F. (4° C.)), and comparing the acquired SOC value with a predetermined SOC range (i.e., 35-65%). Based on those comparisons, a determination can be made as to whether the conditions are met. If it is determined that these two conditions are, in fact, met, the correlation between internal resistance and capacity based on the linear internal resistance/capacity relationship can be used to estimate the battery capacity for a given internal resistance calculated under those particular conditions. Therefore, if these conditions are met, method 100 would proceed to the next steps described below. On the other hand, if it is determined that the requisite conditions are not met, the method would not proceed any further.

In another exemplary embodiment, rather than determining whether certain battery-related threshold or preliminary conditions are met and then either proceeding to next steps of the method only when such conditions are met, substep 106 comprises determining which one or ones of a plurality of threshold or preliminary battery-related conditions are met. More particularly, as described above, a correlation between the internal resistance and the capacity of a battery having a certain battery chemistry may be established for any number of conditions. Accordingly, once it is determined which condition or combination of conditions has/have been met, the appropriate correlation can be used estimate the battery capacity for a given internal resistance calculated under those conditions. Therefore, if a certain one or ones of a plurality of threshold conditions are met, method 100 may proceed to the next steps described below. On the other hand, if none of the plurality of threshold conditions (or not enough of the conditions) are met, the method would not proceed any further.

For example, assume that in an exemplary embodiment correlations between internal resistance and capacity have been determined for the following SOC ranges: 25-45%; 46-65%; and 66-85%. In such an embodiment, if it is determined that the SOC of the battery is 50%, it will be determined that the second condition is met, but the first and third conditions are not. Accordingly, the correlation corresponding to the second condition may be used to estimate the battery capacity for a given internal resistance calculated under that condition, and therefore, the method may proceed as described below. If, however, the SOC were fall outside any of these ranges, and therefore, none of these conditions are satisfied, the method would not proceed any further, but rather may either stop or return back to substep 104.

In an exemplary embodiment, additional threshold or preliminary conditions not necessarily related to battery-related parameters may be used in conjunction with those conditions described above. For example, an additional threshold condition may be that there has been a service request to estimate the capacity of the battery pack. In such an instance, the capacity of the battery pack is not estimated unless a service request to do so has been received. Another additional threshold condition may be that the vehicle has been operated for a predetermined period of time. Accordingly, in such an instance, the capacity of the battery pack is not estimated unless the vehicle has been operated for at least that predetermined period of time. Yet another threshold condition may be that the battery pack has a particular battery chemistry. Accordingly, in such an instance, the capacity of the battery pack is not estimated unless it is determined that the battery pack has that particular chemistry. It will be appreciated that the conditions described above have been provided for exemplary purposes only and are not intended to comprise an exhaustive list of threshold conditions that may be used and/or evaluated. Accordingly, those of ordinary skill in the art will appreciate that embodiments wherein threshold conditions other than or in addition to those described above may be used remain within the spirit and scope of the present disclosure.

Substep 106 may be performed by any number of components or modules. For example, in an exemplary embodiment, the battery control module 30 is configured to perform the processing substep 106. Alternatively, in another exemplary embodiment, substep 106 is performed by the control module 22, or another module of the vehicle 10. Accordingly, it will be appreciated that any number of components of the vehicle 10 may be configured to perform substep 106.

Once it has been determined that one or more required threshold conditions have been met, or its determined which, if any, of a plurality of threshold conditions have been met, in an exemplary embodiment, method 100 further comprises a step 108 of calculating the internal resistance of the battery pack. While in an exemplary embodiment step 108 is performed following step 102, in another exemplary embodiment, step 108 is performed before step 102. Accordingly, the present disclosure is not limited to any particular order or sequence of steps 102 and 108. The calculated internal resistance may take a number of forms and may be calculated in a number of ways.

For example, the calculated internal resistance may comprise a real-time internal resistance of the battery pack, an average internal resistance of the battery pack, or some other resistance-based parameter. In any event, and generally speaking, the internal resistance may be calculated using values of electrical parameters of the battery pack, such as, for example, the overall pack voltage and the current flowing through the battery pack, that are sensed, measured, or detected by sensors such as, for example, the sensors 32, and the voltage sensor 42 and current sensor 44, in particular.

The calculation of the internal resistance may be performed in a number of ways using a number of techniques. One such technique provided for exemplary purposes only is that described in U.S. patent application Ser. No. 13/228,608 filed on Sep. 9, 2011, the entire disclosure of which is incorporated herein by reference. To summarize, however, in a first substep 110 of calculating step 108, values of the battery pack voltage and battery pack current are determined. More particularly, a voltage sensor (e.g., voltage sensor 42) measures the battery pack voltage, which may correspond to the overall voltage drop across the entire battery pack, and a current sensor (e.g., current sensor 44) measures the current flowing through the battery pack. In an exemplary embodiment, due to voltage and current fluctuations in the battery pack, these measurements are obtained in a synchronous fashion.

In a second substep 112 of step 108, adjustments or modifications are made to one or more of the sensor readings corresponding to the pack voltage and pack current to take into account phenomena like hysteresis and polarization. Any suitable technique for removing the effects of hysteresis, polarization, or any other non-ideal components that may skew the sensor readings or data may be used to perform this substep.

Finally, in a third substep 114 of step 108, one or more of the sensor readings corresponding to the battery pack voltage and current may be used to determine the battery pack internal resistance. In one embodiment, this comprises one of the components described above such as, for example, battery control module 30, control module 22, or other suitable component calculating or estimating the internal resistance by plugging the values for battery pack voltage and battery pack current into the mathematical expression for Ohm's law ($V=I*R$). In an exemplary embodiment, this calculation may be performed using regression techniques involving previous values for the battery pack voltage and current (e.g., values or data collected over a predetermined period of time).

It will be appreciated that while the technique described above has been described in relative detail, the present disclosure is not meant to be limited to such a technique for calculating internal resistance. Rather, any number of other techniques for calculating or determining the internal resistance of a battery pack may be used in place of the technique described above. Thus, those of ordinary skill in the art will appreciate that embodiments of method 100 wherein the internal resistance of a battery pack is calculated using techniques other than that described above remain within the spirit and scope of the present disclosure. Further, it will be appreciated, as eluded to above, that step 108 may be performed by any number of components, such as, for example, battery control module 30, control module 22, or any other suitable module of vehicle 10.

Following the calculation of the internal resistance in step 108, the method 100 comprises a further step 116 of estimating the capacity of the battery pack based on the internal resistance calculated in step 108.

In an exemplary embodiment, step 116 comprises plugging the calculated internal resistance value into an equation or algorithm, the output of which is an estimated magnitude of the battery capacity. In another exemplary embodiment, values of other battery-related parameters may be plugged into an equation or algorithm along with the calculated internal resistance value. For example, because the internal resistance/capacity correlation is dependent upon one or more predetermined battery-related conditions, step 116 may comprise plugging values of the battery-related parameter(s) corresponding to those battery-related condition(s) into the equation or algorithm in addition to the calculated internal resistance value.

In another exemplary embodiment, rather than plugging the calculated internal resistance value into an equation or algorithm, step 116 comprises using the calculated internal resistance with a data structure, such as, for example, a one- or multi-dimensional look-up table, that correlates internal resistance values with corresponding estimated battery capacity magnitudes. Accordingly, in such an embodiment, step 116 comprises inputting or looking up the calculated internal resistance in an appropriate data structure to obtain an estimated battery capacity magnitude corresponding to that particular calculated internal resistance.

More particularly, as described above, the internal resistance/capacity correlation is dependent upon one or more battery-related conditions. Accordingly, in order to obtain an accurate battery capacity estimate, the data structure used to determine an estimated battery capacity magnitude for a given internal resistance must correspond to the one or more predetermined battery-related conditions upon which the correlation depends.

For example, for certain battery-related threshold conditions, a particular data structure, such as that set forth in Table 1 below, is created that correlates internal resistance with battery capacity for internal resistances calculated under those particular battery-related conditions.

TABLE I

| Internal Resistance (Ω) | Capacity (%) |
|---|---|
| $\Omega_1$ | $C_1$ |
| $\Omega_2$ | $C_2$ |
| $\Omega_3$ | $C_3$ |
| ... | ... |
| $\Omega_N$ | $C_N$ |

The data structure in Table I may then be used to determine an estimated battery capacity for a given internal resistance calculated under those particular conditions. The data structure may be created using empirical data resulting from bench testing prior to manufacture in conjunction with, in certain instances, techniques, such as linear regression techniques. Accordingly, if it is determined that the requisite conditions have been met, the data structure corresponding to those conditions is appropriate to use in estimating the capacity of the battery pack. Thus, assuming that the threshold conditions corresponding to the data structure of Table I are met, and an internal resistance of $\Omega_1$ is calculated, the data structure in Table I and the calculated internal resistance may be used to estimate the capacity of the battery pack to be $C_1$.

In an embodiment wherein certain threshold or preliminary conditions must be met in order to estimate the battery capacity based on the internal resistance of the battery pack, a single data structure corresponding to that or those particular condition(s) may be used since battery pack capacity is only estimated when that or those particular threshold condition(s) is/are met. In other exemplary embodiments, however, multiple data structures corresponding to different conditions or combinations of conditions may be used depending on the particular conditions that exist at the time the internal resistance is calculate.

For instance, in an exemplary embodiment, rather than step 102 comprising the evaluation of whether one or more battery-related threshold conditions are met and then estimating the battery capacity only when that or those condition(s) are met, step 102 comprises either determining which, if any, of a plurality of conditions are met, or simply determining the particular condition(s) that are present based on the values of one or more corresponding battery-related parameters. Step 116 then comprises estimating the battery capacity for an internal resistance calculated under that or those particular condition(s).

In such an embodiment, data structures correlating internal resistance with battery capacity may be created for internal resistances calculated under any number of conditions. Each data structure may then be used to determine an estimated battery capacity for a given internal resistance calculated under the respective conditions corresponding that particular data structure. As with the data structure described above and illustrated in Table I, data structures for each desired condition or combination of conditions may be created using empirical data resulting from bench testing prior to manufacture, and in certain circumstances, data processing techniques known in the art such as, for example, regression techniques.

Accordingly, in an embodiment wherein multiple data structures exist, once it is determined which condition(s) is/are met or exist, the estimating step 116 may comprise a substep 118 of selecting an appropriate data structure corresponding to that or those conditions. Substep 118 may be performed automatically by the module or component performing estimating step 116, or may be performed by a user, such as, for example, a service person, using a suitable user interface such as, for example, a keyboard, a keypad, a graphical user interface, etc. In any event, once the appropriate data structure is selected, it may be used to estimate the capacity of a battery pack having a given internal resistance calculated under the corresponding conditions in the same manner described above with respect to the use of Table I.

For example, in an exemplary embodiment, values for the temperature of the battery pack and the SOC of the battery pack may be acquired and used to determine which of a plurality of conditions relating to temperature and SOC are met. Assume that one set of conditions comprises the temperature of the battery pack exceeding a temperature of $T_1$ and the SOC falling within the range of $SOC_1$-$SOC_3$, and a second set of conditions comprises the temperature exceeding a temperature of $T_2$ and the SOC falling within the range of $SOC_4$-$SOC_6$. Assume further that the acquired value for the temperature of the battery pack of $T_3$ exceeds $T_1$ but not $T_2$, and the acquired value for the SOC is $SOC_2$, and therefore falls within the range of $SOC_1$-$SOC_3$. These values may be used to evaluate the two sets of conditions set forth above, and based on that evaluation, it can be determined that the first set of conditions is met, and the second set is not. Based on that determination, a data structure corresponding to the first set of conditions may be selected and used to estimate the capacity of a battery pack having a given internal resistance calculated under those particular conditions.

In another exemplary embodiment, the acquired values of certain battery-related parameters may be used to determine or select which of a plurality of data structures are appropriate to use regardless of whether certain specific threshold conditions are met. For example, assume, as with the examples above, that two battery-related parameters of interest are the temperature of the battery pack and the SOC of the battery pack. In such an embodiment, values for the temperature of the battery pack and the SOC of the battery pack are acquired and then used to select a data structure that corresponds to the particular values of those two battery-related parameters (i.e., the battery-related conditions corresponding to those parameter values). As with the example set forth above, once the appropriate data structure is selected, it may be used to estimate the capacity of a battery pack having a given internal resistance calculated under the conditions corresponding to those particular battery-related parameter values.

Whether one or multiple data structures may be used, in an exemplary embodiment, the data structure(s) may be stored in a memory or other storage device of a module or component of vehicle 10. For example, the data structure(s) may be stored in the memory 54 of the control module 22, a memory of the battery control module 30, or any other memory or storage device that is part of or accessible by the component or module performing the step 116, which, in an exemplary embodiment, may comprise the control module 22, the battery control module 30, or any other suitable component/module.

Once the capacity of the battery pack has been estimated, it may be used in a number of ways or for a number of purposes. In an exemplary embodiment, the estimated capacity magnitude may be accurate enough to be used as an input to one or more vehicle-related algorithms. These algorithms may include, for example, a cell balancing algorithm and a battery pack SOC-determining algorithm. Accordingly, in such an embodiment, method 100 may further comprise a step 120 of providing the estimated capacity magnitude as an input to one or more algorithms.

While the use of a limited number of battery-related parameters (e.g., SOC of the battery pack and temperature of the battery pack) corresponding to one or more battery-related threshold conditions to determine the internal resistance/capacity correlation yields a sufficiently accurate capacity estimate for certain applications (e.g., cell balancing and battery pack SOC-determining algorithms), in other applications, such as, for example, range-determining algorithms for electric vehicles, a more accurate estimate may be required. One way in which the accuracy of the estimate may be increased or optimized is to take into account battery-related parameters other than those corresponding to the threshold or preliminary conditions, and/or the specific values of the battery-related parameters corresponding to those conditions. Accordingly, in certain embodiments, the more battery-related parameters and/or specific values of battery-related parameters that are taken into consideration, the more accurate or optimized the estimated capacity may be.

For example, in an exemplary embodiment, the threshold or preliminary conditions relate to the temperature of the battery pack and the SOC of the battery pack. Accordingly, an internal resistance/capacity correlation for given values of the temperature of the battery pack and the SOC of the battery pack may result in a capacity estimate that is sufficiently accurate for use with, for example, an SOC-determining algorithm. However, if the particular value(s) of one or both of the temperature of the battery pack and the SOC of the battery pack, and/or value(s) of one or more additional battery-related parameters, such as, for example, the current flowing through the battery pack or the overall pack voltage, is/are also taken into account, a more accurate capacity estimate may result. Thus, in an exemplary embodiment, certain battery-related conditions and specific values of "optimizing parameters" (i.e., the battery-related parameters corresponding to the threshold conditions or values of other battery-related parameters of interest) may be used together to yield a more accurate capacity estimate.

Accordingly, in an exemplary embodiment, once it is determined in step 102 that required threshold conditions have been met, which of a plurality of battery-related conditions exist, or values of one or more battery-related parameters corresponding to one or more battery-related conditions is/are evaluated, estimating step 116 may comprise using the calculated internal resistance with a multi-dimensional data structure (e.g., multi-dimensional look-up table) that correlates internal resistance and value(s) of one or more optimizing battery-related parameters with battery pack capacity to estimate the capacity of a battery pack.

For example, Table II below illustrates an exemplary two-dimensional look-up table corresponding to arbitrary predetermined threshold conditions.

TABLE II

|  | $I_1$ | $I_2$ | $I_3$ | ... | $I_N$ |
|---|---|---|---|---|---|
| $\Omega_1$ | $C_{11}$ | $C_{21}$ | $C_{31}$ | ... | $C_{N1}$ |
| $\Omega_2$ | $C_{12}$ | $C_{22}$ | $C_{32}$ | ... | $C_{N2}$ |
| .... | ... | ... | ... | ... | ... |
| $\Omega_N$ | $C_{1N}$ | $C_{2N}$ | $C_{3N}$ | ... | $C_{NN}$ |

Table II correlates the internal resistance of a battery pack calculated under the requisite threshold conditions and the optimizing parameter of current flowing through the battery pack under the requisite conditions with battery pack capacity. Accordingly, in an exemplary embodiment, once it is determined that the required threshold conditions are met, step 116 comprises inputting or looking up the value of the calculated internal resistance and the value of the current (acquired either in step 102 or in another additional step of method 100), and finding the capacity value in the data structure corresponding to the values of both parameters, which will be the estimated capacity for a battery pack having that given internal resistance at that particular current under the requisite battery-related condition(s). For example, in an exemplary embodiment wherein the calculated internal resistance is $\Omega_2$ and the current value is $I_3$, using Table II the capacity of the battery pack can be estimated to be $C_{32}$.

It will be appreciated that while in the example above the current through the battery pack is used as an optimizing battery-related parameter, the present disclosure is not meant to be so limited. Rather, other battery-related parameters, such as, for example, specific values of the SOC, temperature of the battery pack, or the overall voltage of the battery pack may be used instead of the current. Further, in another exemplary embodiment, multiple additional optimizing parameters may be used. In such an embodiment, a data structure having a sufficient number of dimensions may be used or multiple data structures may be used. For example, in an embodiment wherein two optimizing battery-related parameters are used, a three-dimensional data structure may be used; in an embodiment wherein three optimizing parameters are used, a four-dimensional the data structure may be used; and so on and so forth. Accordingly, any number of data structures may be created to correspond to the different battery-related parameters or combinations of parameters that may be used to optimize the capacity estimate.

In any event, and as with the one-dimensional data structures described above wherein only internal resistance is correlated with battery pack capacity, one or more multi-dimensional data structures that take into account one or more battery-related optimizing parameters in the correlation between internal resistance and capacity may be created through bench testing and the empirical data resulting therefrom.

As with the embodiment described above wherein optimization parameters are not taken into account, in an embodiment wherein optimization parameters are used in estimating battery capacity, the capacity estimate may be used in a number of ways or for a number of purposes. For example, in such an embodiment, the method may further comprise step 120 of providing the estimated capacity magnitude as an input to one or more algorithms, such as, for example and without limitation, a cell-balancing algorithm, a SOC-determining algorithm, and a range-determining algorithm.

It will be appreciated that the above described methodology may be performed at any time and for any number of purposes. For example, when a vehicle is being serviced, a service technician may initiate the methodology to evaluate the condition of the battery system. Similarly, when a control module configured to control, govern, or otherwise manage the operation/function of the battery system of a vehicle is replaced during a service event, the methodology may be performed by the replacement control module so that it will have an accurate estimate of the capacity of the battery. Accordingly, the present method may be performed at any time for any number of purposes.

It is to be understood that the foregoing description is not a definition of the invention, but is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, the specific combination and order of steps is just one possibility, as the present method may include a combination of steps that has fewer, greater or different steps than that shown here. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A method for estimating the capacity of a battery element in a vehicle, the method comprising the steps of:
   (a) determining if one or more threshold conditions have been met by detecting a battery temperature value and a battery state-of-charge (SOC) value using one or more vehicle battery sensors, and using a vehicle control module to compare the battery temperature value to a predetermined minimum temperature and the battery SOC value to a predetermined SOC range, and determining that the threshold conditions have been met when the battery temperature value exceeds the predetermined minimum temperature and the battery SOC value is within the predetermined SOC range;
   (b) calculating the internal resistance of the battery element using the vehicle control module; and
   (c) when the threshold conditions have been met, using the calculated internal resistance of the battery element to estimate the capacity of the battery element using the vehicle control module.

2. The method of claim 1, wherein step (c) further comprises using the calculated internal resistance of the battery element and a data structure to estimate the capacity of the battery element, and the data structure correlates internal resistance (input) with capacity (output).

3. The method of claim 1, further comprising the step of:
   (d) providing the estimated capacity of the battery element to one or more algorithms that use battery capacity as an input, wherein the one or more algorithms includes at least one of the following algorithms: a cell balancing algorithm or a state-of-charge (SOC) determining algorithm.

4. The method of claim 1, wherein step (a) is performed prior to step (b), and step (b) is performed only if the one or more threshold conditions have been met.

5. The method of claim 1, wherein step (c) further comprises acquiring one or more values for one or more battery-related parameters that pertain to the battery element, and using the one or more battery-related parameter values and the calculated internal resistance of the battery element to estimate the capacity of the battery element.

6. The method of claim 5, wherein the one or more battery-related parameters includes at least one of the following parameters: a battery temperature, a battery voltage, a battery state-of-charge (SOC), or a battery current.

7. The method of claim 5, further comprising the step of:
   (d) providing the estimated capacity of the battery element to one or more algorithms that use battery capacity as an input, wherein the one or more algorithms include at least one of the following algorithms: a cell balancing algorithm, a state-of-charge (SOC) determining algorithm, or a range-determining algorithm for a vehicle.

8. The method of claim 5, wherein step (c) further comprises using the calculated internal resistance of the battery element, the one or more battery-related parameter values and a multi-dimensional data structure to estimate the capacity of the battery element, and the data structure correlates internal resistance (input) and battery parameters (input) with capacity (output).

9. The method of claim 1, further comprising the step of:
   servicing a battery system in the vehicle by replacing a first control module with a second control module, and after the second control module has been installed in the battery system then performing steps (a)-(c).

10. The method of claim 1, wherein the vehicle is a hybrid electric vehicle and includes a power battery system that includes the battery element, and the battery element includes at least one of the following elements: a battery pack, a portion of a battery pack, a block of cells in a battery pack, or an individual cell in a battery pack.

11. A method for estimating the capacity of a battery element in a vehicle, the method comprising the steps of:
   servicing a battery system in the vehicle by replacing a first control module with a second control module, and after the second control module has been installed in the battery system, then performing the following steps (a)-(c);
   (a) calculating the internal resistance of the battery element using a vehicle control module;
   (b) acquiring one or more values for one or more battery-related parameters that pertain to the battery element using one or more vehicle battery sensors; and
   (c) using the vehicle control module to estimate the capacity of the battery element based on the calculated internal resistance of the battery element, a multi-dimensional data structure, and the one or more acquired battery-related parameter values, wherein the multi-dimensional data structure correlates internal resistance (input) and battery parameters (input) with capacity (output).

12. The method of claim 11, wherein step (a) further comprises determining if one or more threshold conditions have been met, and only calculating the internal resistance of the battery element if the one or more threshold conditions have been met.

13. The method of claim 12, wherein step (a) further comprises receiving a battery temperature value and a battery state-of-charge (SOC) value, comparing the battery temperature value to a predetermined minimum temperature and the battery SOC value to a predetermined SOC range, and determining that the threshold conditions have been met when the battery temperature value exceeds the predetermined minimum temperature and the battery SOC value is within the predetermined SOC range.

14. The method of claim 11, wherein the one or more battery-related parameters includes at least one of the following parameters: a battery temperature, a battery voltage, a battery state-of-charge (SOC), or a battery current.

15. The method of claim 11, further comprising the step of:
   (d) providing the estimated capacity of the battery element to one or more algorithms that use battery capacity as an input, wherein the one or more algorithms include at least one of the following algorithms: a cell balancing algorithm, a state-of-charge (SOC) determining algorithm, or a range-determining algorithm for a vehicle.

16. The method of claim 11, wherein the vehicle is a hybrid electric vehicle and includes a power battery system that includes the battery element, and the battery element includes at least one of the following elements: a battery pack, a portion of a battery pack, a block of cells in a battery pack, or an individual cell in a battery pack.

17. A battery system for a vehicle, comprising:
   a battery element;
   one or more battery sensors configured to detect electrical parameters of the battery element; and
   a control module electrically coupled to the one or more battery sensors, wherein the control module is configured to:
   (a) determine if one or more threshold conditions have been met prior to performing step (b) by detecting a battery temperature value and a battery state-of-charge (SOC) value using one or more vehicle battery sensors, and using a vehicle control module to compare the battery temperature value to a predetermined minimum temperature and the battery SOC value to a predetermined SOC range, and determining that the threshold conditions have been met when the battery temperature value exceeds the predetermined minimum temperature and the battery SOC value is within the predetermined SOC range;
   (b) only if the one or more threshold conditions in step (a) have been met, calculate the internal resistance of the battery element using the detected electrical parameters of the battery element; and
   (c) estimate the capacity of the battery element based on the calculated internal resistance of the battery element.

* * * * *